US008981801B2

(12) United States Patent
Wu et al.

(10) Patent No.: US 8,981,801 B2
(45) Date of Patent: Mar. 17, 2015

(54) POSITIONING DEVICE FOR TESTING RESISTANCE OF CAMERA MODULE

(71) Applicants: Chun-Fu Wu, New Taipei (TW); Cheng-An Lin, New Taipei (TW)

(72) Inventors: Chun-Fu Wu, New Taipei (TW); Cheng-An Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 235 days.

(21) Appl. No.: 13/667,194

(22) Filed: Nov. 2, 2012

(65) Prior Publication Data
US 2013/0169299 A1 Jul. 4, 2013

(30) Foreign Application Priority Data

Dec. 29, 2011 (TW) .............................. 100149481 A

(51) Int. Cl.
*G01R 27/08* (2006.01)
*G01R 1/04* (2006.01)
(52) U.S. Cl.
CPC .................................... *G01R 1/0408* (2013.01)
USPC ....................................................... 324/724
(58) Field of Classification Search
CPC .................................................... G01R 1/0408
See application file for complete search history.

(56) References Cited

U.S. PATENT DOCUMENTS

2006/0245712 A1* 11/2006 Fishman et al. ............... 385/134
2008/0180128 A1* 7/2008 Binette et al. ................. 324/765

FOREIGN PATENT DOCUMENTS

KR 20100027848 A * 9/2008 ............ H01R 33/76

* cited by examiner

*Primary Examiner* — Melissa Koval
*Assistant Examiner* — Courtney McDonnough
(74) *Attorney, Agent, or Firm* — Novak Druce Connolly Bove + Quigg LLP

(57) ABSTRACT

A positioning device includes a positioning mechanism, a contacting mechanism located in the positioning mechanism, and a connecting mechanism located adjacent to an end of the positioning mechanism. The positioning mechanism includes a receiving member, a positioning member received in the receiving member, and a cover rotatable connected to the receiving member. The receiving member defines two sliding grooves. The cover defines two driving grooves corresponding to the two sliding grooves, each of the two driving grooves forms a driving surface, and the sliding block includes a slanted surface corresponding to the driving surface. When the cover is rotated to cover the receiving member, the driving surface resists with the slanted surface to drive the sliding block to move towards the positioning groove until the first contacting member contacts one testing point of the camera module.

14 Claims, 5 Drawing Sheets

POSITIONING DEVICE FOR TESTING RESISTANCE OF CAMERA MODULE

BACKGROUND

1. Technical Field

The present disclosure generally relates to positioning devices, and particularly to a positioning device for testing a resistance of a camera module.

2. Description of Related Art

In a process of manufacturing a camera module, a resistance of the camera module is needed to be tested. Two testing points on the camera module are determined by visual method, and two probes of a multimeter are operated to contact the two testing points by an operator respectively, to test the resistance of the camera module. However, because the two testing points are determined by sight, the two testing points on different camera modules may be different from one another. In addition, the contact force exerted on different camera modules by the probes may be different from one another, which will affect the accuracy of the testing result for resistance of the camera modules.

Therefore, there is room for improvement in the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
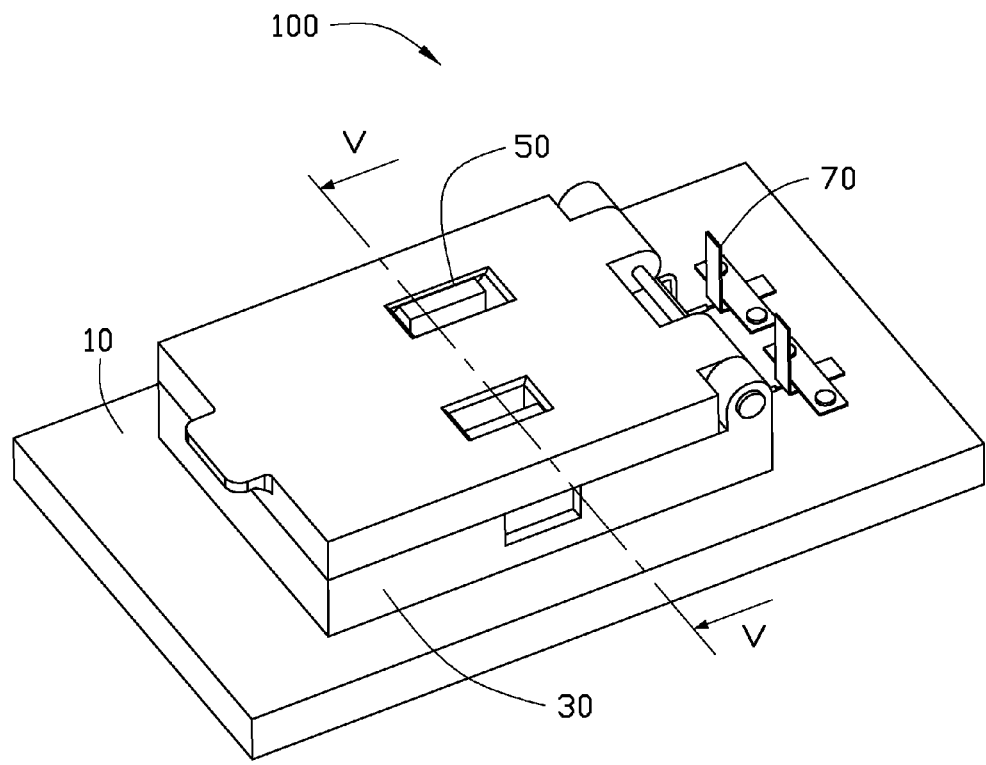
FIG. 1 is an assembled, isometric view of an embodiment of a positioning device.
Figure 2:
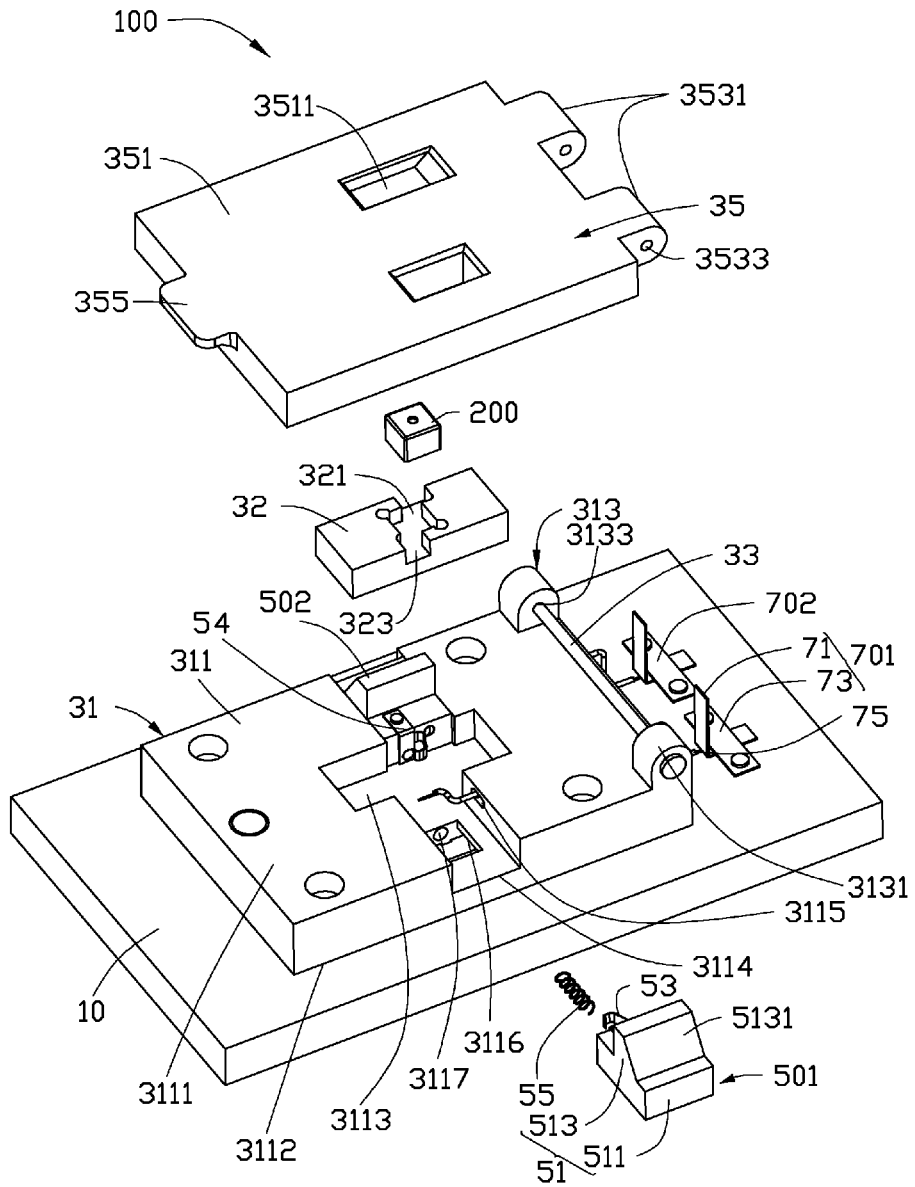
FIG. 2 is an exploded, isometric view of the positioning device of FIG. 1 loaded with a camera module.

Referring to FIGS. 1 and 2, an embodiment of a positioning device 100 is shown. The positioning device 100 is used for positioning a camera module 200 when conducting testing of a resistance of the camera module 200. The positioning device 100 includes a base board 10, a positioning mechanism 30, a contacting mechanism 50, and a connecting mechanism 70. The positioning mechanism 30 is located on the base board 10 for receiving a camera module 200. The contacting mechanism 50 is located in the positioning mechanism 30 for contacting two testing points (not labeled) of a camera module 200. The connecting mechanism 70 is fastened on the base board 10 for connecting with a multimeter (not shown). In the illustrated embodiment, the camera module 200 is substantially a hexahedron in shape. The two testing points on the camera module 200 are defined at opposite side surfaces of the camera module 200. In alternative embodiments, the camera module 200 may be in other types of shapes, and the two testing points of the camera module 200 may change position, correspondingly.

The base board 10 is a substantially rectangular board. The base board 10 is used for loading the positioning mechanism 30, the contacting mechanism 50, and the connecting mechanism 70.

The positioning mechanism 30 includes a receiving member 31, a positioning member 32, a rotating shaft 33, and a cover 35. The cover 35 is rotatably connected to the receiving member 31 via the rotating shaft 33, and the positioning member 32 is received in the receiving member 31 for positioning the camera module 200.

Figure 3:
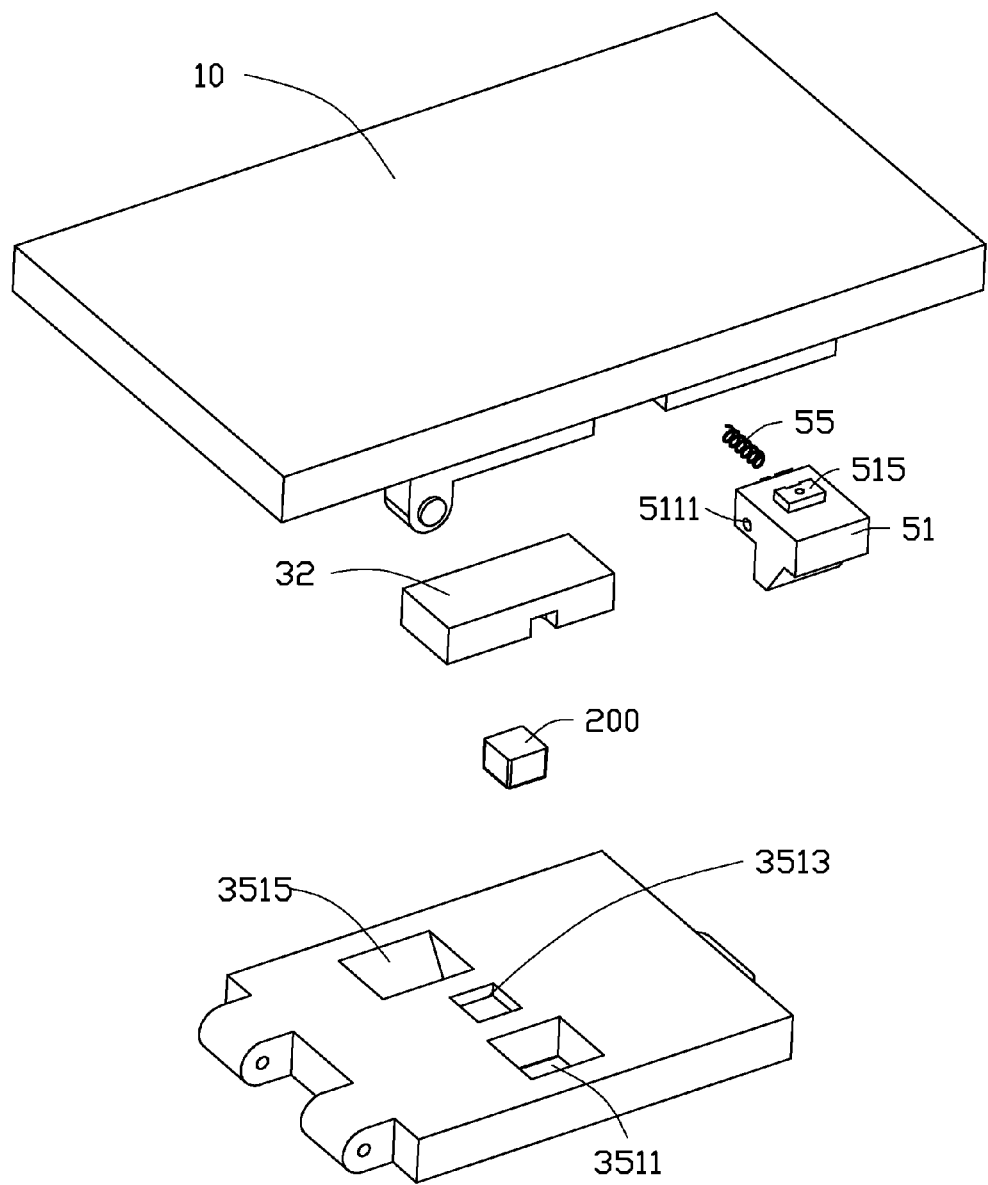
FIG. 3 is similar to FIG. 2, but viewed from another aspect.
Figure 4:
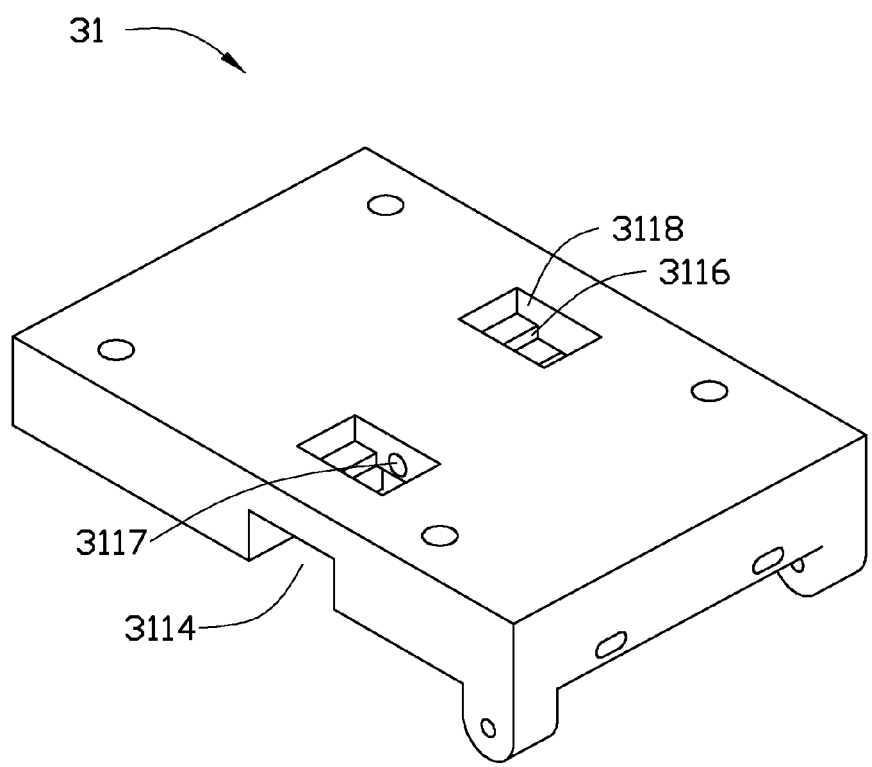
FIG. 4 is an isometric view of the receiving member of FIG. 1.
Figure 5:
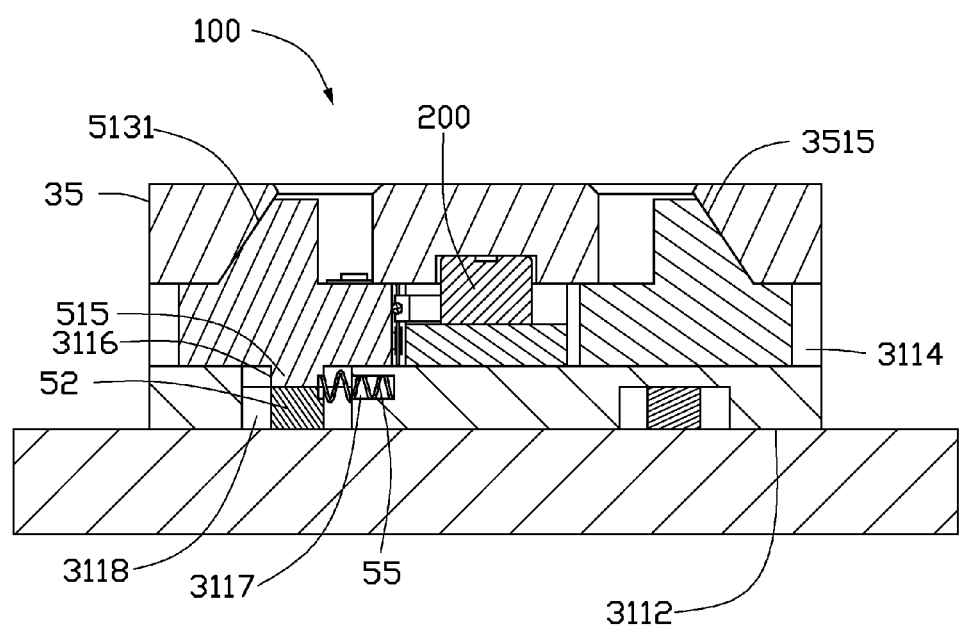
FIG. 5 is a cross-sectional view of the positioning device of FIG. 1, taken along the line V-V.

Referring to FIGS. 3 through 5, the receiving member 31 includes a base portion 311 and a pivotal portion 313 formed at an end of the base portion 311. The base portion 311 is a substantially rectangular board, and is fastened at about the middle portion of the base board 10. The base portion 311 includes a first surface 3111 away from the base board 10 and a second surface 3112 opposite to the first surface 3111 adjacent to the base board 10. The first surface 3111 defines a receiving groove 3113 and two first sliding grooves 3114 communicating with the receiving groove 3113. The receiving groove 3113 is substantially rectangular. The two first sliding grooves 3114 are located at opposite sides of the receiving groove 3113, respectively, for receiving the contacting mechanism 50, and are staggered from each other. One sidewall of each of the two first sliding grooves 3114 defines a through hole 3115 extending towards the pivotal portion 313 of the receiving member 31. The bottom surface of each of the two first sliding grooves 3114 defines a restricting groove 3116. A sidewall of each restricting groove 3116 adjacent to the receiving groove 3113 defines a receiving hole 3117. The second surface 3112 defines two second sliding grooves 3118 (see FIG. 4) corresponding to the two first sliding grooves 3114, and the two second sliding grooves 3118 are communicating with the two first sliding grooves 3114, respectively, via the two restricting grooves 3116. The pivotal portion 313 includes two supporting seats 3131 located symmetrically with respect to each other. Each of the two supporting seats 3131 defines a pivot hole 3133, and the two pivot holes 3133 are coaxial to each other. Two ends of the rotating shaft 33 are rotatably fastened in the two pivot hole 3133 of the pivotal portion 313, respectively.

The positioning member 32 is a substantially rectangular board. The positioning member 32 is detachably received in the receiving groove 3113 of the base portion 311 of the receiving member 31. The positioning member 32 defines a positioning groove 321 at about the middle portion thereof and two connecting grooves 323 communicating with the positioning groove 321. The positioning groove 321 is substantially rectangular, and is used for receiving one camera module 200. The two connecting grooves 323 are located at opposite sides of the positioning groove 321 corresponding to the two first sliding grooves 3114, which can facilitate the contacting mechanism 50 to contact to the two testing points of the camera module 200. It is apparent that the shape of the positioning groove 321 can be changed and configured to be adapted to the shape of the camera module 200, and the two testing points of the camera module 200 can be also changed correspondingly.

The cover 35 includes a base board 351, two connecting portions 3531 extending from an end of the base board 351, and an operating portion 355 extending from an end of the base board 351 away from the two connecting portions 3531. The connecting portion 3531 and the operating portion 355 are formed at opposite ends of the base board 351. The base board 351 can be a substantially rectangular board, and the size of the base board 351 is about the same as that of the base portion 311 of the receiving member 31. The base board 351 defines two driving grooves 3511 at about the middle portion thereof corresponding to the two first sliding grooves 3114 of the base board 311. The base board 351 further defines a receiving groove 3513 between the two driving grooves 3511 corresponding to the positioning groove 321 of the positioning member 32. Each of the two driving grooves 3511 can be substantially rectangular. The width of two opposite side walls of each of the two driving grooves 3511 gradually becomes smaller along a direction away from the receiving member 31, and one of the two opposite side walls of each driving groove 3511 forms a driving surface 3515. The driving surface 3515 is a slanted surface. The driving surface 3515 of each of the two driving grooves 3511 are symmetrical to the middle portion of the base board 351.

Each of the two connecting portions 3531 defines a shaft hole 3533, and the cover 35 is rotatably connected to the receiving member 31 via the two connecting portions 3531 rotatably sleeved on the rotating shaft 33. The operating portion 355 can be a substantially rectangular protrusion, and is used to facilitate the rotation of the cover 35.

The contacting mechanism 50 includes a first contacting module 501 and a second contacting module 502 located at opposite sides of the receiving member 31. In the illustrated embodiment, the structure of the first contacting module 501 is the same as the structure of the second contacting module 502, and each of the first contacting module 501 and the second contacting module 502 is received in one corresponding first sliding groove 3114. The first contacting module 501 includes a first sliding block 51, a second sliding block 52 (see FIG. 5), a first contacting member 53, a fixing member 54, and an elastic member 55.

The first sliding block 51 includes a mounting portion 511, a driving portion 513 extending from a top surface of the mounting portion 511, and a connecting portion 515 extending from a bottom surface of the mounting portion 511 opposite to the driving portion 513. In one embodiment, the mounting portion 511 can be a substantially rectangular block, and is slidably received in one corresponding first sliding groove 3114 of the receiving member 31. A side surface of the mounting portion 511 adjacent to the receiving groove 3113 of the receiving member 31 defines a communicating hole 5111 (see FIG. 3) communicating with the through hole 3115. The driving portion 513 is substantially a wedge. In the illustrated embodiment, the driving portion 513 is protruded out of the corresponding first sliding groove 3114, and is received in one corresponding driving groove 3511 of the cover 35. The driving portion 513 includes a slanted surface 5131 corresponding to the driving surface 3515. When the cover 35 is rotated towards the receiving member 31, the driving surface 3515 resists the slanted surface 5131 to drive the first sliding block 51 to slide towards the positioning groove 321 of the positioning member 32. The connecting portion 515 can be a substantially rectangular block, and is slidably received in the restricting groove 3116 of the receiving member 31.

The second sliding block 52 is slidably received in one corresponding second sliding groove 3118 of the receiving member 31. The second sliding block 52 is non-movably connected to the connecting portion 515 of the first sliding block 51. A width of each restricting grooves 3116 is smaller than a width of one corresponding second sliding groove 3118 in a direction perpendicular to the sliding direction of the second sliding block 52. A width of the second sliding block 52 is wider than the width of the restricting groove 3116, which can restrict the movement of the second sliding block 52 along a direction perpendicular to the base portion 311. The first contacting member 53 is a curved, conductive, and elastic element. The fixing member 54 is substantially L-shaped, and is used for fastening the first contacting member 53 to a sidewall of the first sliding block 51 adjacent to the positioning groove 321. One end of the elastic member 55 is fastened in the receiving hole 3117 of the receiving member 31, and the other end of the elastic member 55 is fastened to the second sliding block 52 and the connecting portion 515 of the first sliding block 51.

In an alternative embodiment, the restricting groove 3116 can be omitted, and the first sliding groove 3114 communicates with the second sliding groove 3118. The first sliding block 51 and the second sliding block 52 can be integrally formed. It is apparent that the base board 10 can be omitted correspondingly.

The connecting mechanism 70 includes a first connecting module 701 and a second connecting module 702. The first connecting module 701 and the second connecting module 702 are loaded at an end of the base board 10 adjacent to the pivotal portion 313 of the receiving member 31. In the illustrated embodiment, the structure of the first connecting module 701 is the same as the structure of the second connecting module 701. The first connecting module 701 includes a second connecting member 71, a fixing member 73, and a conducting wire 75. The second connecting member 71 is a substantially L-shaped conducting sheet. The fixing member 73 is fastened on the end of the base board 10 adjacent to the pivotal portion 313 of the receiving member 31, and is used for fastening the second connecting member 71. The conducting wire 75 passes through the communicating hole 5111 of the first sliding block 51 and the through hole 3115 of the receiving member 31, one end of the conducting wire 75 connects to the second connecting member 71, and the other end of the conducting wire 75 connects to the first contacting member 53 of the contacting mechanism 50.

In testing for resistance, a camera module 200 is received in the positioning groove 321 of the positioning member 32. Two probes of the multimeter are connected to the two second connecting members 71. As the elastic member 55 is resisting with the first sliding block 51 and the second sliding block 52, the first contacting member 53 cannot contact the two testing points of the camera module 200. Rotating the cover 35 to cover the receiving member 31, the driving surface 3515 of the cover 35 resists with the slanted surface 5131 of the mounting portion 511 to drive the first sliding block 51 and the second sliding block 52 to move towards the positioning groove 321 until the first contacting member 53 contacts the two testing points of the camera module 200. Then, the multimeter can test the resistance of the camera module 200. The compressed elastic force of the elastic member 55 drives the first sliding block 51 and the second sliding block 52 to return to their original state, after the cover 35 is rotated forwardly away from the receiving member 31.

The receiving member 31, the positioning member 32, and the contacting mechanism 50 cooperatively determine and configure the two testing points of the camera module 200, thus the two testing points of each camera module 200 are then accurate. In addition, the two first contacting members 53 contact the two testing points of the camera module 200, respectively, as the driving surface 3515 of the cover 35 resists with the slanted surface 5131 of the mounting portion 511 to drive the first sliding block 51 and the second sliding block 52 to move towards the positioning groove 321, and thus ensuring the contact force of different camera modules 200 is to be the same, or within a controlled manner. Thus, the accuracy of the testing result on resistance of the camera modules 200 is improved.

In alternative embodiments, the elastic member 55 can be omitted, and the contacting mechanism 50 can be returned to its original state via manual adjustment.

In alternative embodiments, the surface of each of the first contacting member 53 and the second connecting member 71 can be coated with a gold layer to reduce the resistance of the first contacting member 53 and the second connecting member 71, in order to improve the accuracy of the testing result for resistance of the camera modules 200.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A positioning device, used for testing a resistance of a camera module, comprising:
    a positioning mechanism comprising a receiving member, a positioning member received in the receiving member, and a cover rotatable connected to the receiving member, the receiving member defining two sliding grooves, the positioning member defining a positioning groove for receiving the camera module, and the two sliding grooves located at opposite sides of the positioning groove and communicating with the positioning groove;
    a contacting mechanism located in the positioning mechanism, comprising a first contacting module and a second contacting module, each of the first contacting module and the second contacting module comprising a sliding block slidably received in one corresponding sliding groove and a first contacting member fastened to the sliding block adjacent to the positioning groove; and
    a connecting mechanism located adjacent to an end of the positioning mechanism, comprising two second connecting members, and each of the two second connecting members electrically connected to one corresponding first contacting member, wherein the cover defines two driving grooves corresponding to the two sliding grooves, a width of each of the two driving grooves gradually becomes smaller along a direction away from the receiving member to form a driving surface, the sliding block comprises a slanted surface corresponding to the driving surface, when the cover is rotated to cover the receiving member, the driving surface resists with the slanted surface to drive the sliding block to move towards the positioning groove until the first contacting member contacts one testing point of the camera module.

2. The positioning device of claim 1, wherein each of the first contacting module and the second contacting module further comprises an elastic member, one end of the elastic member resists with the receiving member, the other end of the elastic member resists the sliding block, and the compressed elastic force of the elastic member drives the sliding block to return to its original state.

3. The positioning device of claim 1, wherein each of the two sliding grooves comprises a first sliding groove and a second sliding groove arranged along a direction perpendicular to the sliding direction of the sliding block, the receiving member further defines two restricting grooves, one of the restricting grooves communicates the first sliding groove and the second sliding groove of one corresponding sliding groove, the sliding block of each of the first contacting module and the second contacting module comprises a first sliding block and a second sliding block fastened to the first sliding block, the first sliding block is slidably received in one corresponding first sliding groove, the second sliding block is slidably received in one corresponding second sliding groove, and the width of the second sliding block is wider than the width of the restricting groove, and the movement of the second sliding block is restricted along a direction perpendicular to the sliding direction of the second sliding block.

4. The positioning device of claim 3, wherein the first sliding block comprises a mounting portion, a driving portion extending from one surface of the mounting portion, the mounting portion is slidably received in one first sliding groove, the driving portion is protruded out of the first sliding groove and is received in one driving groove, and the slanted surface is formed on the driving portion.

5. The positioning device of claim 4, wherein the first contacting member is fastened to a sidewall of the first sliding block adjacent to the positioning groove.

6. The positioning device of claim 4, wherein the first sliding block further comprises a connecting portion extending from another surface of the mounting portion opposite to the driving portion.

7. The positioning device of claim 1, wherein the receiving member further defines a receiving groove, the positioning member is detachably received in the receiving groove, and the two sliding grooves are located at opposite sides of the receiving groove, and are staggered with each other.

8. The positioning device of claim 1, wherein the receiving member comprises a base portion and a pivotal portion formed at an end of the base portion, the two sliding grooves are defined in the base portion, and one sidewall of each of the two sliding grooves defines a through hole extending towards the pivotal portion of the receiving member, and the connecting mechanism further comprises a conducting wire passing through the through hole to connect the first contacting member and the second connecting member.

9. The positioning device of claim 8, further comprises a rotating shaft fastened to the pivotal portion of the receiving member, and the cover is rotatably connected to the receiving member via the rotating shaft.

10. The positioning device of claim 9, wherein the cover comprises a base board, two connecting portions extending from an end of the base board, and an operating portion extending from an end of the base board away from the two connecting portions, the two driving grooves are defined in the base board, and the cover is rotatably connected to the receiving member via the two connecting portions rotatably sleeved on the rotating shaft.

11. The positioning device of claim 10, wherein the pivotal portion includes two supporting seats located symmetrically with respect to each other, each of the two supporting seats defines a pivot hole, the two pivot holes are coaxial to each other, and the two connecting portions are rotatably sleeved on the rotating shaft via the two pivot holes.

12. The positioning device of claim 1, wherein the first contacting member is a curved, conductive, and elastic element.

13. The positioning device of claim 1, wherein the positioning member further defines two connecting grooves communicating with the positioning groove, the two connecting grooves are located at opposite sides of the positioning groove corresponding to the two sliding groove.

14. The positioning device of claim 1, wherein the surface of each of the first connecting member and the second connecting member is coated with a gold layer to reduce the resistance of the first connecting member and the second connecting member.

* * * * *